(12) United States Patent
Matsumoto

(10) Patent No.: US 7,496,375 B2
(45) Date of Patent: Feb. 24, 2009

(54) TRANSMISSION POWER CONTROL DEVICE

(75) Inventor: Hidenori Matsumoto, Kanagawa (JP)

(73) Assignee: Panasonic Corporation, Osaka (JP)

( * ) Notice: Subject to any disclaimer, the term of this patent is extended or adjusted under 35 U.S.C. 154(b) by 431 days.

(21) Appl. No.: 10/589,076

(22) PCT Filed: Feb. 8, 2005

(86) PCT No.: PCT/JP2005/001836

§ 371 (c)(1),
(2), (4) Date: Aug. 11, 2006

(87) PCT Pub. No.: WO2005/078939

PCT Pub. Date: Aug. 25, 2005

(65) Prior Publication Data

US 2007/0176681 A1 Aug. 2, 2007

(30) Foreign Application Priority Data

Feb. 12, 2004 (JP) ............................. 2004-035027

(51) Int. Cl.
*H04B 7/00* (2006.01)
*H04B 1/04* (2006.01)

(52) U.S. Cl. ................. 455/522; 455/127.3; 455/250.1; 455/108

(58) Field of Classification Search ................. 455/522, 455/126, 127.2, 127.3, 241.1, 245.2, 247.1, 455/250.1, 69, 67.11
See application file for complete search history.

(56) References Cited

U.S. PATENT DOCUMENTS 5,655,220 A * 8/1997 Weiland et al. ............... 455/69

6,320,913 B1 * 11/2001 Nakayama ................... 375/297

(Continued)

FOREIGN PATENT DOCUMENTS

JP 8331108 12/1996

(Continued)

OTHER PUBLICATIONS

Japanese Office Action dated Mar. 20, 2007 with English Translation.
PCT International Search Report dated May 24, 2005.

*Primary Examiner*—Duc M Nguyen
(74) *Attorney, Agent, or Firm*—Dickinson Wright, PLLC

(57) ABSTRACT

A transmission power control apparatus which reduces the number of steps required for adjustments of the transmission power control apparatus and performs transmission power control with high accuracy in a wide dynamic range. The apparatus has a first variable amplifying circuit (122) with the resolution of 1 dB and a second variable amplifying circuit (123) with the resolution of 0.1 dB, where a correction value calculating section (106) calculates a correction value to compensate for deterioration in the accuracy of transmission power caused by a change in environment due to frequency characteristics and temperature characteristics and another correction value to compensate for error in transmission power, a transmission power calculating section (107) calculates transmission power obtained by correcting with the correction value specified transmission power to output to a communicating party based on the received signal, and a first set value calculating section (108) and a second set value calculating section (109) calculate gain values to set on the first variable amplifying circuit (122) and second variable amplifying circuit (123) based on the corrected transmission power, respectively.

8 Claims, 11 Drawing Sheets

U.S. PATENT DOCUMENTS

| | | | |
|---|---|---|---|
| 6,438,360 B1 * | 8/2002 | Alberth et al. | 455/110 |
| 6,463,264 B1 | 10/2002 | Obara | |
| 6,526,266 B1 | 2/2003 | Obara | |
| 6,587,513 B1 * | 7/2003 | Ichihara | 375/296 |
| 6,594,501 B2 * | 7/2003 | Black et al. | 455/522 |
| 6,819,938 B2 * | 11/2004 | Sahota | 455/522 |
| 6,870,435 B2 * | 3/2005 | Ahmed | 332/103 |
| 7,058,139 B2 * | 6/2006 | Duperray | 375/297 |
| 7,139,537 B2 * | 11/2006 | Nakayama | 455/522 |
| 7,280,839 B2 * | 10/2007 | Miura et al. | 455/522 |
| 7,424,064 B2 * | 9/2008 | Shakeshaft et al. | 375/295 |
| 2004/0180686 A1 | 9/2004 | Nakayama | |

FOREIGN PATENT DOCUMENTS

| | | |
|---|---|---|
| JP | 1174806 | 3/1999 |
| JP | 11177444 | 7/1999 |
| JP | 200013254 | 1/2000 |
| JP | 2000201089 | 7/2000 |
| JP | 2003243997 | 8/2003 |
| JP | 2003258654 | 9/2003 |
| JP | 2003298429 | 10/2003 |
| JP | 200432447 | 1/2004 |
| WO | 03001701 | 1/2003 |

* cited by examiner

| GAIN SET FOR FIRST VARIABLE AMPLIFYING CIRCUIT | GAIN IN FIRST VARIABLE AMPLIFYING CIRCUIT |
|---|---|
| 0[dB] | x[dB] |
| 1[dB] | x+1[dB] |
| 2[dB] | x+2[dB] |
| 3[dB] | x+3[dB] |
| 4[dB] | x+4[dB] |
| 5[dB] | x+5[dB] |
| ⋮ | ⋮ |
| n−1[dB] | x+(n−1)[dB] |
| n[dB] | x+n[dB] |

FIG.4

| GAIN SET FOR SECOND VARIABLE AMPLIFYING CIRCUIT | GAIN IN SECOND VARIABLE AMPLIFYING CIRCUIT |
|---|---|
| −0.1*m[dB] | −0.1*m[dB] |
| −0.1*(m−1)[dB] | −0.1*(m−1)[dB] |
| ⋮ | ⋮ |
| −0.2[dB] | −0.2[dB] |
| −0.1[dB] | −0.1[dB] |
| 0[dB] | 0[dB] |
| 0.1[dB] | 0.1[dB] |
| 0.2[dB] | 0.2[dB] |
| ⋮ | ⋮ |
| 0.1*(m−1)[dB] | 0.1*(m−1)[dB] |
| 0.1*m[dB] | 0.1*m[dB] |

FIG.5

| SPECIFIED TRANSMISSION POWER VALUE [dBm] | VARIABLE AMPLIFYING CIRCUIT SET VALUE [dB] |
|---|---|
| −56[dBm] | (p−80)+0.1*q[dB] |
| ⋮ | ⋮ |
| −3[dBm] | (p−27)+0.1*q[dB] |
| −2[dBm] | (p−26)+0.1*q[dB] |
| −1[dBm] | (p−25)+0.1*q[dB] |
| 0[dBm] | (p−24)+0.1*q[dB] |
| ⋮ | ⋮ |
| +23[dBm] | (p−1)+0.1*q[dB] |
| +24[dBm] | p+0.1*q[dB] |

| FREQUENCY [MHz] | FREQUENCY CORRECTION VALUE [dB] |
|---|---|
| f1 | r1[dB] |
| f2 | r2[dB] |
| f3 | r3[dB] |
| f4 | r4[dB] |
| f5 | r5[dB] |
| ⋮ | ⋮ |
| f11 | r11[dB] |
| f12 | r12[dB] |

TRANSMISSION POWER CONTROL DEVICE

TECHNICAL FIELD

The present invention relates to a transmission power control apparatus and is suitable for application to a radio communication apparatus such as, for example, a base station apparatus and communication terminal apparatus.

BACKGROUND ART

A radio communication apparatus needs to increase transmission power to transmit signals so as to enable a communicating party to receive the signals, but when the power is excessively increased, the radio communication apparatus interferes with radio communication apparatuses other than the communicating party. Therefore, by performing transmission power control, the power is adjusted to suitable transmission power whenever necessary.

In general, as described in Patent Document 1, a transmission power control apparatus uses a variable amplifying circuit with an analog control voltage as its input voltage. The variable amplifying circuit has the gain characteristic proportional to the analog control voltage generated by a D/A converter. However, when a wide dynamic range is required as in a CDMA (Code Division Multiple Access) scheme, it is difficult to maintain linearity of the input/output characteristic (control voltage-gain characteristic) over the entire voltage control range, which is described below with reference to drawings.

FIG. 1 is a graph showing the gain characteristic of a variable amplifying circuit with respect to the analog control voltage. As shown in the figure, in gain control with the analog voltage, the gain shows nonlinearity when the control voltage (DAC code) is low or high, and the control voltage-gain characteristic is not uniform over a wide dynamic range. Therefore, in a conventional transmission power control apparatus, the DAC code for arbitrary transmission power is stored in memory, and read out when necessary to control an amplification rate, and it is thereby possible to obtain accurate transmission power. In addition, the resolution of transmission power is determined by the resolution of the D/A converter and control sensitivity characteristics of the variable amplifying circuit.

Patent Document 1: Japanese Patent Application Laid-Open No. HEI11-177444

DISCLOSURE OF INVENTION

Problems to be Solved by the Invention

However, in the conventional transmission power control apparatus, since adjustments are made to compensate for variations in component, there are steps of obtaining DAC codes corresponding to specified transmission power values over a wide range and storing the obtained DAC codes in memory, and a problem arises of increasing the number of steps required for the adjustments of the transmission power control apparatus.

FIG. 20 shows the DAC code characteristic of a D/A converter with respect to transmission power in using a variable amplifying circuit by analog control. For example, when specified transmission power values are set at regular intervals, DAC codes to implement the values are not at regular intervals. In other words, it is necessary to obtain DAC codes point by point to provide predetermined specified transmission power values. At this point, since the linearity is poor, adjustments are required to compensate for variations in component for each predetermined transmission power.

It is therefore an object of the present invention to provide a transmission power control apparatus which reduces the number of steps required for adjustments of the transmission power control apparatus, and performs transmission power control with high accuracy in a wide dynamic range.

Means for Solving the Problem

A transmission power control apparatus of the present invention adopts a configuration having a first and second variable amplifying circuits that have different gain resolutions and amplify an input signal, a correction value calculator that calculates a correction value to assure the accuracy of transmission power, a transmission power specifier that specifies transmission power to be outputted to a communicating party based on a signal transmitted from the communicating party, a transmission power calculator that corrects the specified transmission power by the correction value and thereby calculates transmission power, and a set value calculator that calculates gain values to be set on the first and second variable amplifying circuits based on the transmission power calculated by the transmission power calculator.

According to this configuration, by providing the first and second variable amplifying circuits with different gain resolutions, taking into consideration the correction value to assure the accuracy of transmission power, and making adjustments of the transmission power control apparatus by measuring only one arbitrary point of transmission power, it is possible to make overall gain characteristics linear and set optimal gain values on the first and second variable amplifying circuits, and therefore, possible to reduce the number of steps required for the adjustments and perform transmission power control with high accuracy in a wide dynamic range.

Advantageous Effect of the Invention

According to the present invention, by providing the first and second variable amplifying circuits with different gain resolutions, taking into consideration a correction value to compensate for deterioration in the accuracy of transmission power caused by a change in environment due to frequency characteristics and temperature characteristics and a correction value to compensate for error in transmission power, and making adjustments of the transmission power control apparatus by measuring only one arbitrary point of transmission power, it is possible to make overall gain characteristics linear and set optimal gain values on the first and second variable amplifying circuits, and therefore, possible to reduce the number of steps required for the adjustments and perform transmission power control with high accuracy in a wide dynamic range.

BRIEF DESCRIPTION OF DRAWINGS

FIG. 4 is a table showing the correspondence relationship between gain set for a first variable amplifying circuit and gain in the first variable amplifying circuit;

FIG. 5 is a table showing the correspondence relationship between gain set for a second variable amplifying circuit and gain in the second variable amplifying circuit;

BEST MODE FOR CARRYING OUT THE INVENTION

Embodiments of the present invention will be described below in detail with reference to the accompanying drawings.

Embodiment 1

Figure 1:
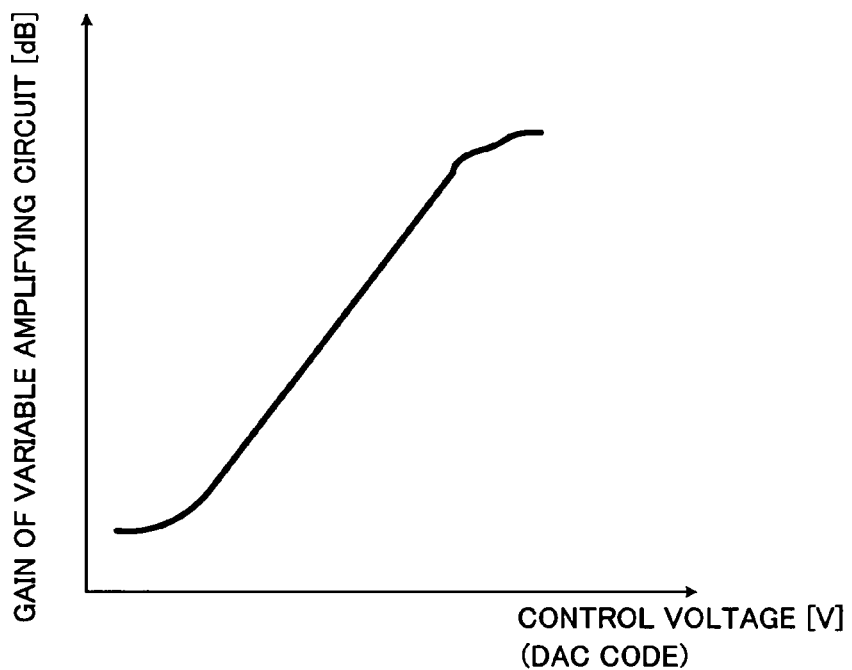
FIG. 1 is a graph showing the gain characteristic of a variable multiplying circuit with respect to the analog control voltage.
Figure 2:
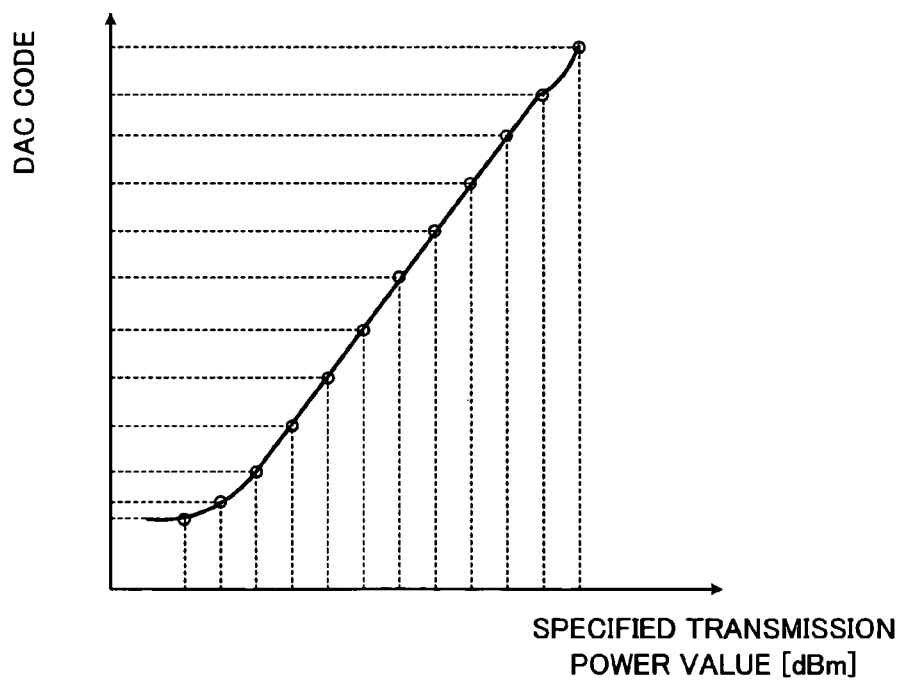
FIG. 2 is a graph showing the DAC code characteristic of a D/A converter with respect to the transmission power in using the variable amplifying circuit by analog control.
Figure 3:
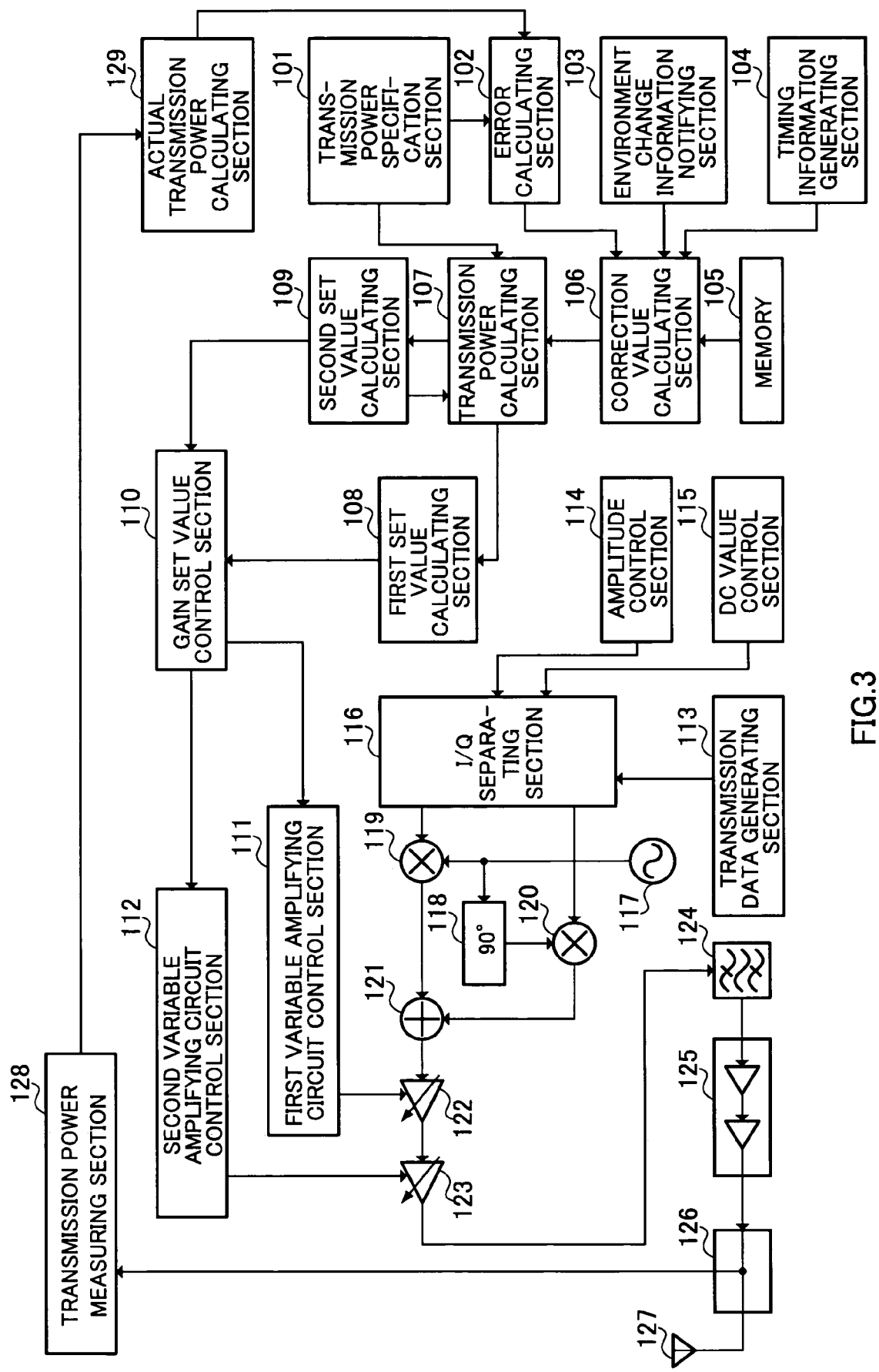
FIG. 3 is a block diagram illustrating a configuration of a transmission power control apparatus according to Embodiment 1 of the present invention.

FIG. 3 is a block diagram illustrating a configuration of a transmission power control apparatus according to Embodiment 1 of the present invention. In this figure, transmission power specification section 101 acquires broadcast information transmitted from a communicating party, and reports transmission power specified by the broadcast information to error calculating section 102 and transmission power calculating section 107.

Error calculating section 102 calculates an error between the transmission power reported from transmission power specification section 101 and actual transmission power calculated in actual transmission power calculating section 129, which will be described later, and outputs the calculated error to correction value calculating section 106. When a change occurs in environment such as temperature and frequency, environment change information report section 103 reports an amount of the change to correction value calculating section 106.

Timing information generating section 104 generates timing information to calculate a correction value, limits a correction value amount that is the number of times the correction value is calculated, and manages a period of calculating the correction value. By this means, for example, in transmission power control in the CDMA scheme, the correction value amount between slots can be kept within a specified value. Timing information generating section 104 outputs the generated timing information to correction value calculating section 106.

Memory 105 stores a correction value to compensate for deterioration in the accuracy of transmission power caused by variations in component and a correction value to compensate for deterioration in the accuracy of transmission power caused by temperature characteristics or frequency characteristics, and outputs the correction values to correction value calculating section 106.

Based on the information outputted from error calculating section 102, environment change information report section 103, timing information generating section 104, and memory 105, correction value calculating section 106 calculates a correction value to compensate for the transmission power with high accuracy, and outputs the calculated correction value to transmission power calculating section 107.

Based on the specified power reported from transmission power specification section 101 and the correction value outputted from correction value calculating section 106, transmission power calculating section 107 calculates transmission power, and outputs the calculated transmission power to first set value calculating section 108 and second set value calculating section 109. Further, when receiving feedback information from second set value calculating section 109, transmission power calculating section 107 reflects the feedback information in calculation of the transmission power.

First set value calculating section 108 has a table as shown in FIG. 4, and based on the transmission power value outputted from transmission power calculating section 107, outputs a gain value for first variable amplifying circuit 122 according to the table in FIG. 4 to gain set value control section 110. Second set value calculating section 109 has a table as shown in FIG. 5, and based on the transmission power value outputted from transmission power calculating section 107, outputs a gain value for second variable amplifying circuit 123 according to the table in FIG. 5 to gain set value control section 110. Further, when the gain value reaches a limit of the dynamic range of second variable amplifying circuit 123, first set value calculating section 108 outputs a feedback signal to transmission power calculating section 107. It is thereby possible to perform gain control within the dynamic range of the second variable amplifying circuit, and to maintain linearity of overall gain characteristics of the first variable amplifying circuit and second variable amplifying circuit.

Based on gain set values outputted from first set value calculating section 108 and second set value calculating section 109, gain set value control section 110 obtains gain codes, and controls first variable amplifying circuit control section 111 and second variable amplifying circuit control section 112 by the obtained gain codes.

First variable amplifying circuit control section 111 controls first variable amplifying circuit 122 according to the gain code outputted from gain set value control section 110. Second variable amplifying circuit control section 112 controls second variable amplifying circuit 123 according to the gain code outputted from gain set value control section 110.

Transmission data generating section 113 generates data to be transmitted to a communicating party, and outputs the generated data to I/Q separating section 116. Amplitude control section 114 outputs a control signal to control the amplitude of an I/Q signal to I/Q separating section 116. It is thereby possible to ensure error vector amplitude (EVM) characteristics due to reduction of side-band suppression, and set the amplitude of signals to be inputted to mixers 119 and 120 at an optimal value. DC value control section 115 outputs a control signal to control a DC value of the I/Q signal to I/Q separating section 116. It is thus possible to ensure EVM characteristics due to reduction of carrier suppression.

I/Q separating section 116 separates transmission data outputted from transmission data generating section 113 into an I-channel signal and Q-channel signal, and performs amplitude control and DC-value control. The I-channel signal is outputted to mixer 119, and the Q-channel signal is outputted to mixer 120.

Local oscillator 117 oscillates carrier frequency. The oscillation signal is multiplied by the I-channel signal in mixer 119, while being shifted 90 degrees in shifter 118 and multiplied by the Q-channel signal in mixer 120. The signals multiplied by the oscillation signal in mixers 119 and 120 are combined in combining circuit 121, and outputted to first variable amplifying circuit 122 as a transmission output signal.

Figure 6:
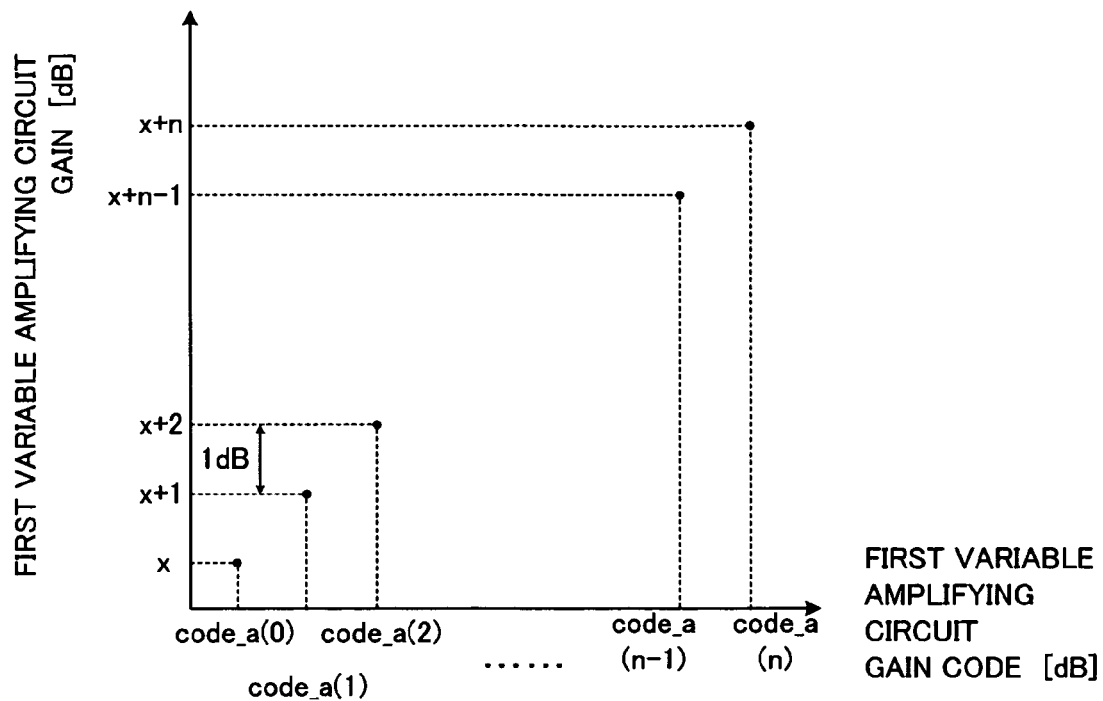
FIG. 6 is a graph showing the gain characteristic of the first variable amplifying circuit in Embodiment 1 of the present invention;.

First variable amplifying circuit 122 has the gain characteristic as shown in FIG. 6, and a gain value can be set every 1 dB by digital control. Then, first variable amplifying circuit 122 amplifies the transmission output signal outputted from combining circuit 121 by the gain value according to control of first variable amplifying circuit control section 111, and outputs the amplified transmission output signal to second variable amplifying circuit 123. In addition, the table in FIG. 4 in the above-described first set value calculating section 108 results from the gain characteristic as shown in FIG. 6.

Figure 7:
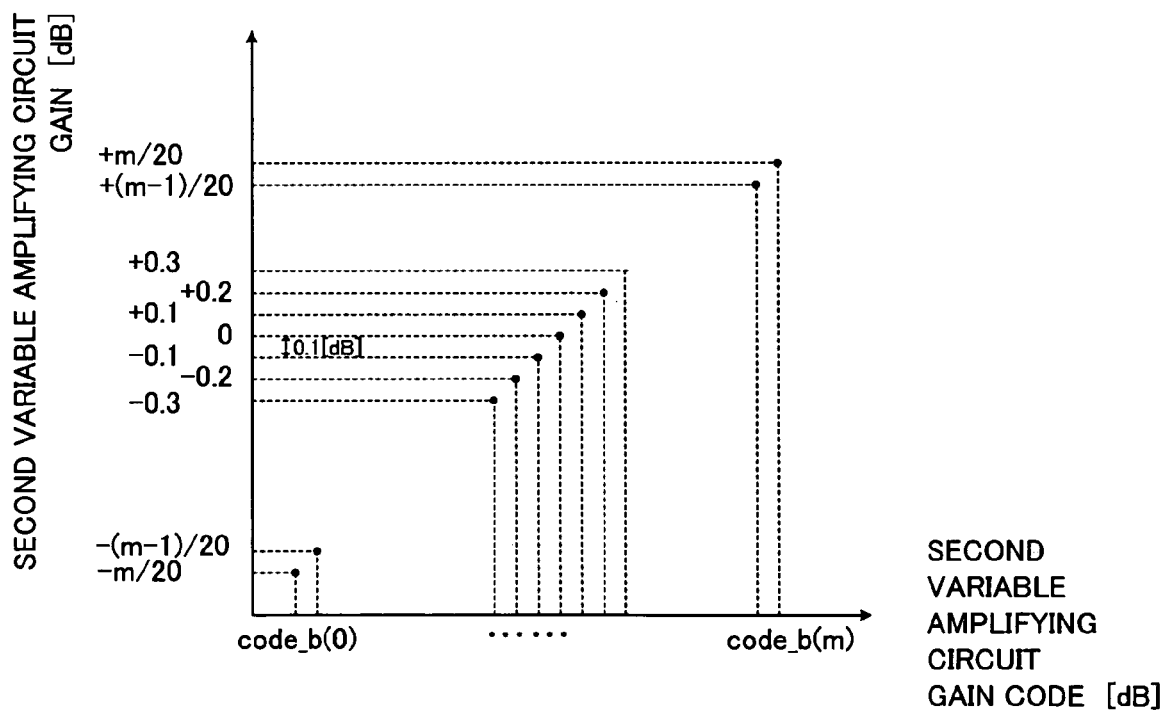
FIG. 7 is a graph showing the gain characteristic of the second variable amplifying circuit in Embodiment 1 of the present invention.

Second variable amplifying circuit 123 has the gain characteristic as shown in FIG. 7, and a gain value can be set every 0.1 dB by digital control. Then, second variable amplifying circuit 123 amplifies the transmission output signal outputted from first variable amplifying circuit 122 by the gain value according to control of second variable amplifying circuit control section 112, and outputs the amplified transmission output signal to band limitation filter 124. In addition, the table in FIG. 5 in the above-described second set value calculating section 109 results from the gain characteristic as shown in FIG. 7.

Figure 8:
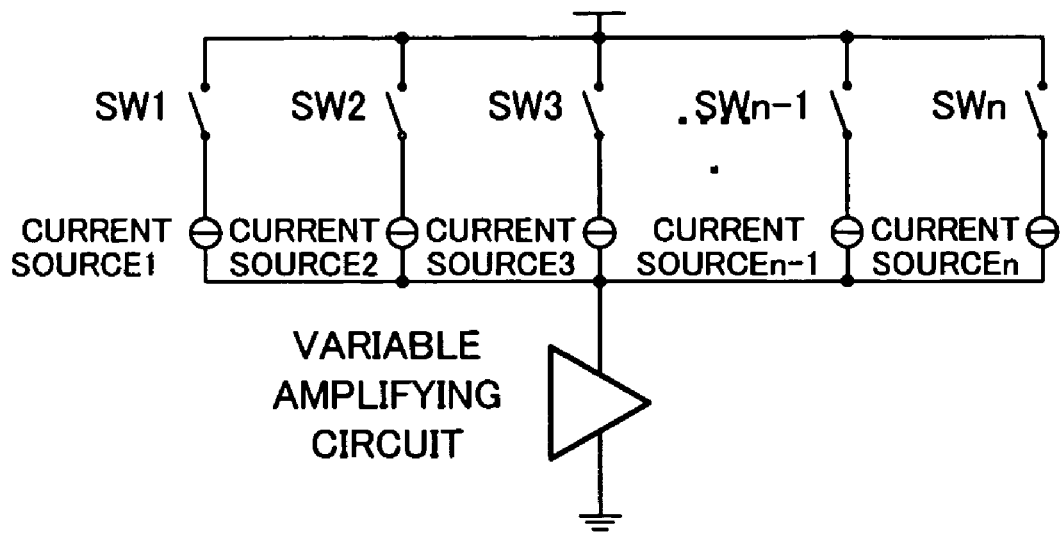
FIG. 8 is a diagram illustrating a configuration of a digital-control variable amplifying circuit by current control.
Figure 9:
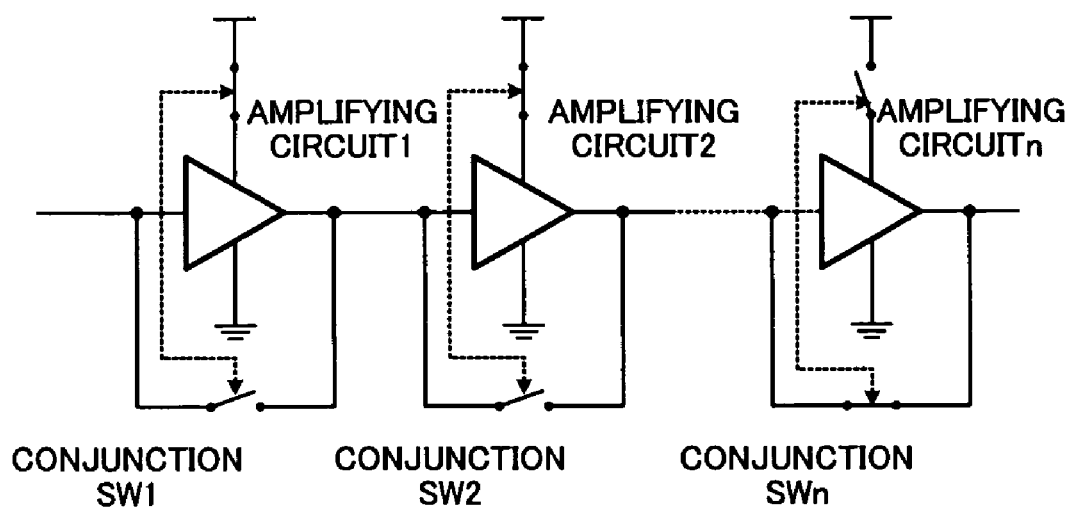
FIG. 9 is a diagram illustrating a configuration of a digital-control variable amplifying circuit by change in the number of steps of the amplifying circuit.

First variable amplifying circuit 122 and second variable amplifying circuit 123 have a configuration as shown in FIG. 8 or FIG. 9. FIG. 8 shows a configuration of a digital-control variable amplifying circuit by current control. In this figure, a plurality of current sources 1 to n and a plurality of switches SW1 to SWn are parallel-connected to a variable amplifying circuit, whereby gain control is performed by a current value. Switching of the switches is performed by digital control, and the gain value is varied. FIG. 9 illustrates a configuration of a digital-control variable amplifying circuit by change in the number of steps of the amplifying circuit. N amplifying circuits are connected in series, a conjunction switch is provided in each of the amplifying circuits, and gain control to control whether or not a signal is inputted to the amplifying circuit is performed by switching the conjunction switch. Herein, switching of the conjunction switch is also performed by digital control, and the gain value is varied.

The transmission output signal amplified in second variable amplifying circuit 123 is band limited in band limitation filter 124, power amplified in power amplifier 125, and branched in coupler 126. One of the branched transmission output signals is transmitted to the communicating party via antenna 127, and the other branched signal is outputted to transmission power measuring section 128.

Figure 10:
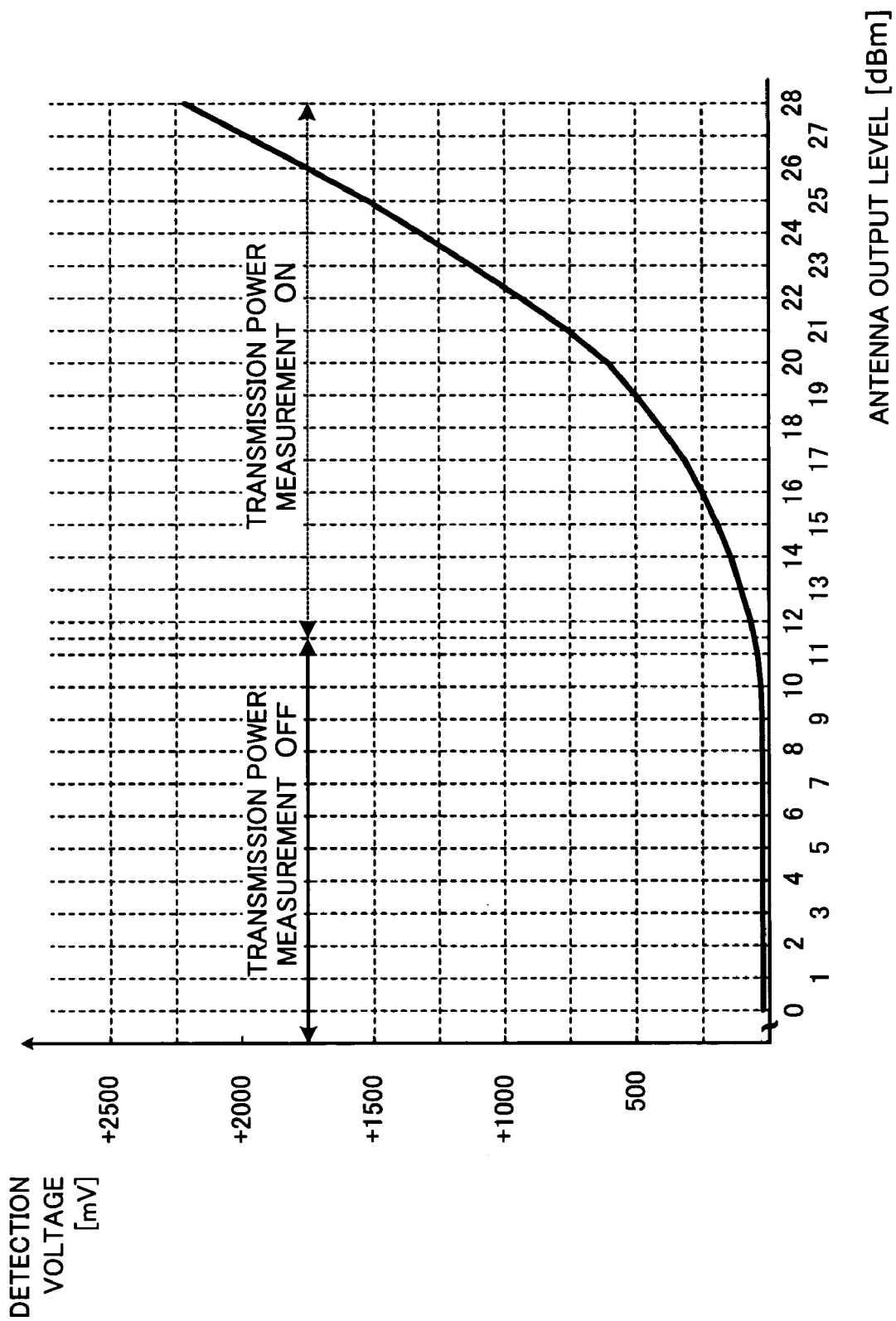
FIG. 10 is a graph showing the transmission power-detection voltage characteristic using a detection diode.

Transmission power measuring section 128 is a detection diode or the like, measures the transmission power, and outputs the measurement result to actual transmission power calculating section 129. Actual transmission power calculating section 129 calculates the transmission power of an actually transmitted signal from the transmission power measured in transmission power measuring section 128, and outputs the calculated actual transmission power to error calculating section 102. In addition, the transmission power-detection voltage characteristic using a detection diode is poor in linearity as shown in FIG. 10, and the detection voltage is uniformly low (for example, 25 mV to 44 mV) over a low transmission power interval (lower than 11.5 dBm). When the transmission power is calculated from the detection voltage by the A/D converter, since the resolution of the transmission power is not sufficiently ensured with respect to the resolution of the A/D converter, the measurement accuracy of the transmission power deteriorates. Therefore, transmission power calculating section 107 reflects the error of transmission power calculated in error calculating section 102 in calculation of a correction value in a range in which enough measurement accuracy of actual transmission power can be obtained i.e. in a range more than predetermined transmission power (specified transmission power). Meanwhile, when the transmission power is less than the predetermined transmission power (specified transmission power), transmission power calculating section 107 does not reflect the error of transmission power in calculation of the correction value. It is thereby possible to perform transmission power control with high accuracy.

Figure 11:
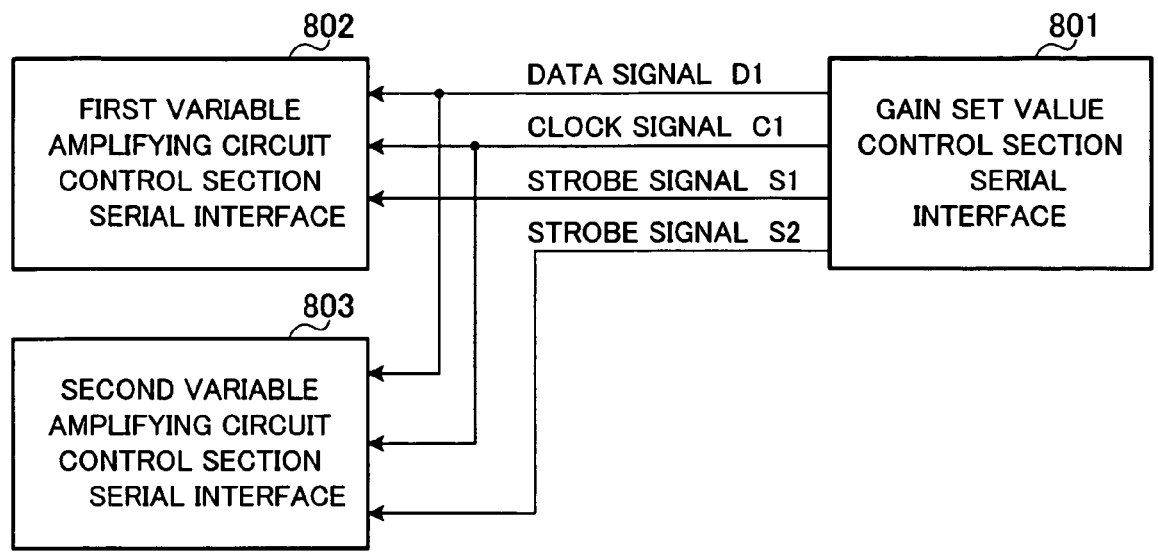
FIG. 11 is a diagram illustrating a configuration where a gain set value control section is connected to a first variable amplifying circuit control section and a second variable amplifying circuit control section with serial interfaces.

Described herein is a specific configuration of gain set value control section 110, first variable amplifying circuit control section 111 and second variable amplifying circuit control section 112. FIG. 11 is a diagram illustrating a configuration where gain set value control section 110 is connected to first variable amplifying circuit control section 111 and second variable amplifying circuit control section 112 with serial interfaces. In this figure, serial interface 801 of the gain set value control section outputs data signal D1, clock signal C1 and strobe signal S1 to serial interface 802 of the first variable amplifying circuit control section. Further, serial interface 801 of the gain set value control section outputs data signal D1, clock signal C1 and strobe signal S2 to serial interface 803 of the second variable amplifying circuit control section. Strobe signals S1 and S2 are to determine whether data is set on serial interface 802 of the first variable amplifying circuit control section or serial interface 803 of the second variable amplifying circuit control section.

Figure 12:
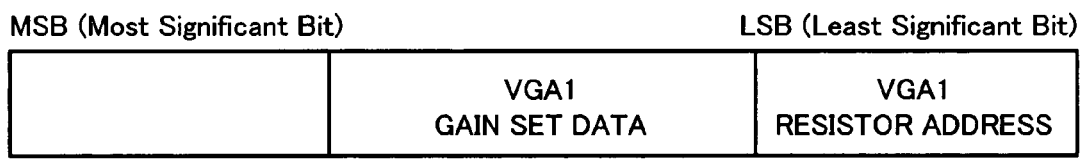
FIG. 12 is a diagram illustrating serial interface formats in Embodiment 1 of the present invention.
Figure 12:
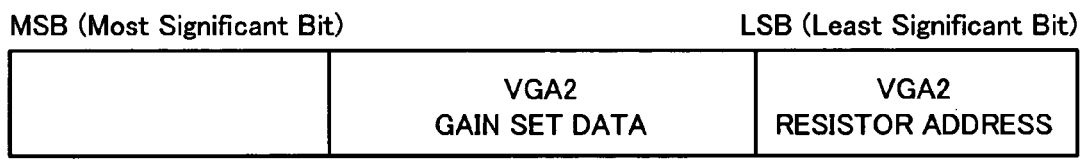

In FIG. 11, the strobe signals corresponding to the serial interfaces are provided, but, as shown in FIG. 12, a strobe signal can be shared by adding to serial data a resistor address to determine which interface is set for data.

Figure 13:
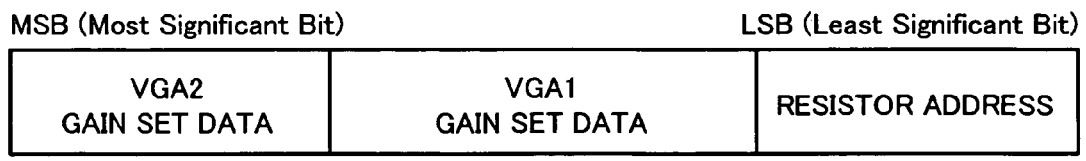
FIG. 13 is a diagram illustrating another serial interface format in Embodiment 1 of the present invention.

Further, when a single control section is used as first variable amplifying circuit control section 111 and second variable amplifying circuit control section 112, as shown in FIG. 13, a single serial interface format can be used. Thus, by independently controlling first variable amplifying circuit control section 111 and second variable amplifying circuit control section 112 using the serial interface formats, even when transmission power control timings are different, the control can be performed at respective timings.

Next, the principle of the transmission power control apparatus in this Embodiment will be described. For example, in the CDMA scheme, the specified transmission power value is specified in a range of −56 to +24 dB, set values of the variable amplifying circuit to obtain the specified transmission power values are as shown in FIG. 14 based on FIGS. 4 and 5.

Figures 14, 15:
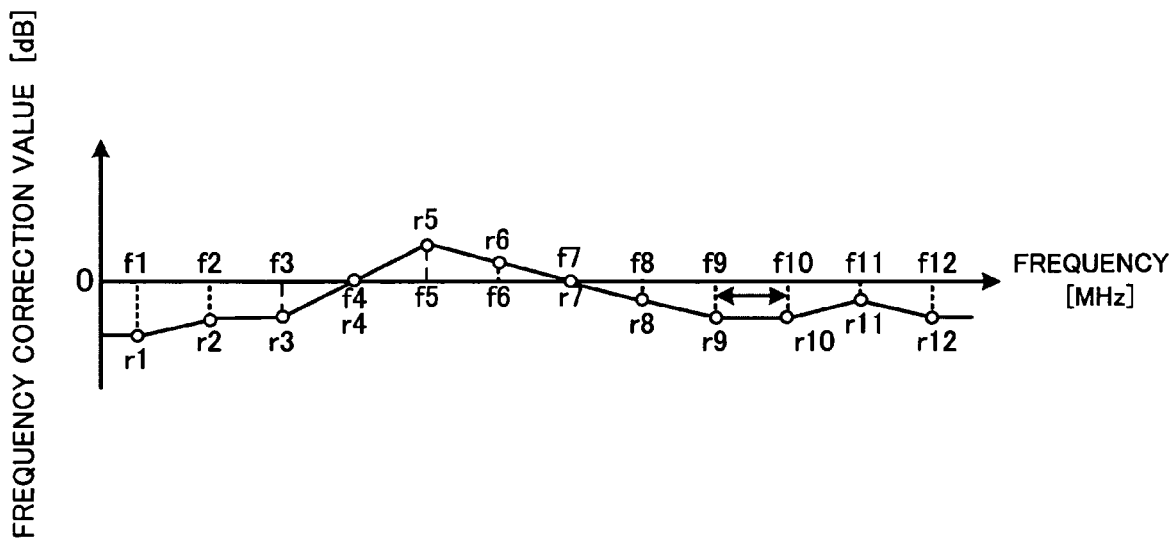
FIG. 14 is a table showing the correspondence relationship between transmission output specified values and variable amplifying circuit set values in a CDMA scheme.
FIG. 15 is a graph showing the relationship between frequencies and correction values.

In FIG. 14, variable amplifying circuit set value p represents an arbitrary gain code within a gain control range of first variable amplifying circuit 122. Further, q represents an arbitrary gain code within a gain control range of second variable amplifying circuit 123. More specifically, p and q indicate correction values for variations in component at given transmission power adjusted at the time of shipment of the product.

The correction value to compensate for deterioration in the accuracy of transmission power due to frequency characteristics will be described below. FIG. 15 is a graph showing the relationship between frequencies and correction values (frequency correction values). In this figure, f1 to f12 are arbitrary frequencies determined to calculate correction values in advance, and r1 to r12 are frequency correction values respectively in association with frequencies f1 to f12. Thus, when the relationship between frequencies and frequency correction values is obtained in advance, by making linear approximation on a frequency between predetermined frequencies, the frequency correction value can be calculated. For example, in the case of calculating frequency correction value r on frequency f between frequencies f1 and f2, the correction value can be calculated by following equation (1).

$$r = \frac{r2 - r1}{f2 - f1} \times f + r2 - \frac{r2 - r1}{f2 - f1} \times f2 \qquad \text{Eq. (1)}$$

Figures 16, 17:
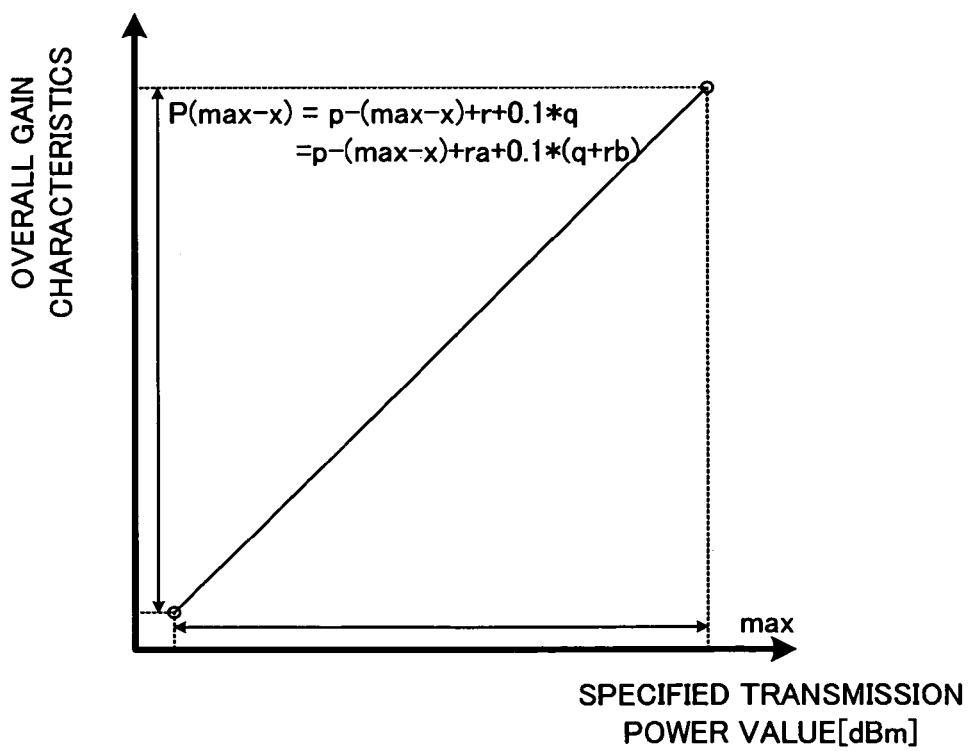
FIG. 16 is a table showing the correspondence relationship between frequencies and correction values.
FIG. 17 is graph showing overall gain characteristics of the transmission power control apparatus according to Embodiment 1 of the present invention.

In the transmission power control apparatus in this Embodiment, the relationship between frequencies and frequency correction values is summarized in a table as shown in FIG. 16, and stored in memory 105, and correction value calculating section 106 performs the operation of above equation (1). It is thereby possible to perform transmission power control with high speed and high accuracy when the frequency is varied.

Calculation of the frequency correction value is described herein, and with respect to calculation of a temperature correction value, the correction value can be calculated also by the same method.

Herein, when an environment correction value such as the above-described frequency correction value and temperature correction value is R, R is also expressed as $R = r_a + 0.1 \times r_b$. From such a relationship, corrected transmission power Pow is expressed by following equation (2).

$$\begin{aligned} Pow(\max - x) &= p - (\max - x) + 0.1 \times q + r \qquad \text{Eq. (2)} \\ &= p - (\max - x) + r_a + 0.1 \times (q + r_b) \end{aligned}$$

In Eq. (2), max indicates the maximum transmission power, and for example, in the above-described W-CDMA scheme, is 24 dBm in power class 3. x indicates an arbitrary value smaller than max. Above equation (2) is comprised of a term of resolution of 1 dB and a term of resolution of 0.1 dB, and it is thus possible to specify an optimal gain value for each of first variable amplifying circuit 122 on which a gain value can be set every 1 dB and second variable amplifying circuit 123 on which a gain value can be set every 0.1 dB. In other words, the gain value set on first variable amplifying circuit 122 is $p-(\max-x)+r_a$, while the gain value set on second variable amplifying circuit 123 is $q+r_b$.

In this way, by combining first variable amplifying circuit 122 and second variable amplifying circuit 123, measuring transmission power at one arbitrary point of the output level, and calculating p and q from above equation (2), it is possible to obtain overall gain characteristics as shown in FIG. 17. In other words, the accuracy is assured over the entire dynamic range according to the specified transmission power value as shown in FIG. 17. Further, since the frequency correction value and temperature correction value are prepared in advance, even when the frequency and/or temperature changes, only by updating environment correction value r, it is possible to implement transmission power control with high accuracy. In addition, the error of transmission power can be corrected in the same way.

According to this Embodiment, by providing the variable amplifying circuit with the resolution of 1 dB and the variable amplifying circuit with the resolution of 0.1 dB, taking into consideration a correction value to compensate for deterioration in the accuracy of transmission power caused by a change in environment due to frequency characteristics and temperature characteristics and a correction value to compensate for error in transmission power, and making adjustments of the transmission power control apparatus by measuring only one arbitrary point of transmission power, it is possible to make overall gain characteristics linear, and set optimal gain values on two variable amplifying circuits so that the number of steps required for the adjustments can be reduced and transmission power control can be performed with high accuracy in a wide dynamic range. Further, since a D/A converter and analog-control variable amplifying circuit are not used, power consumption can be reduced.

Embodiment 2

While Embodiment 1 describes a case providing two variable amplifying circuits with different resolutions, Embodiment 2 of the present invention describes a case providing one variable amplifying circuit.

Figure 18:
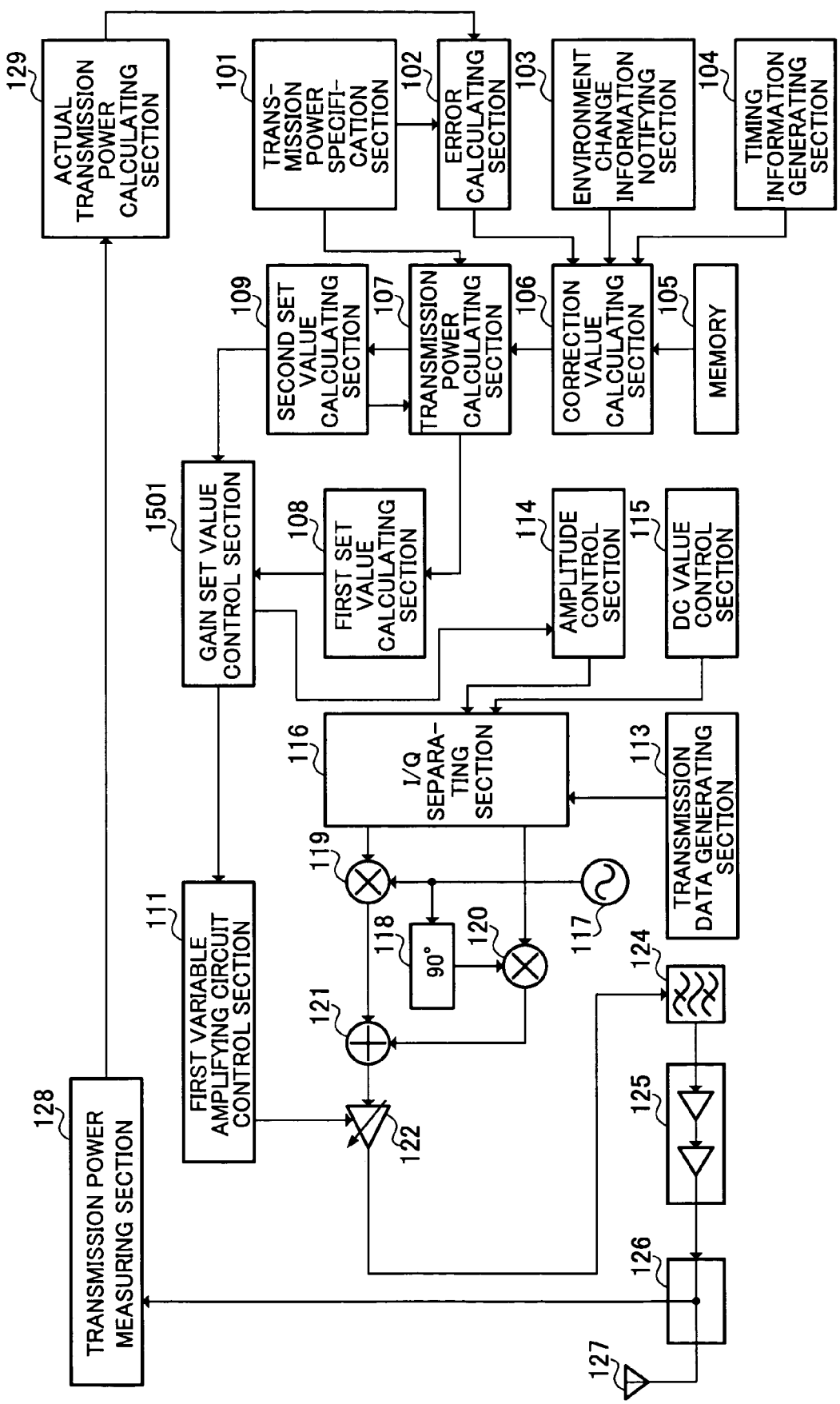
FIG. 18 is a diagram illustrating a configuration of a transmission power control apparatus according to Embodiment 2 of the present invention.

FIG. 18 is a diagram illustrating a configuration of a transmission power control apparatus according to Embodiment 2 of the present invention. In addition, in FIG. 18, sections common to FIG. 3 are assigned the same reference numerals, and descriptions thereof are omitted. FIG. 18 differs from FIG. 3 in that gain set value control section 110 is changed to gain set value control section 1501, and that second variable amplifying circuit control section 112 and second variable amplifying circuit 123 are omitted.

Based on gain set values outputted from first set value calculating section 108 and second set value calculating section (amplitude value calculating section) 109, gain set value control section 1501 obtains gain codes, and controls first variable amplifying circuit control section 111 and amplitude control section 114 by the obtained gain codes.

According to the gain code outputted from gain set value control section 1501, amplitude control section 114 outputs a control signal to control the amplitude of an I/Q signal to I/Q separating section 116.

Figure 19:
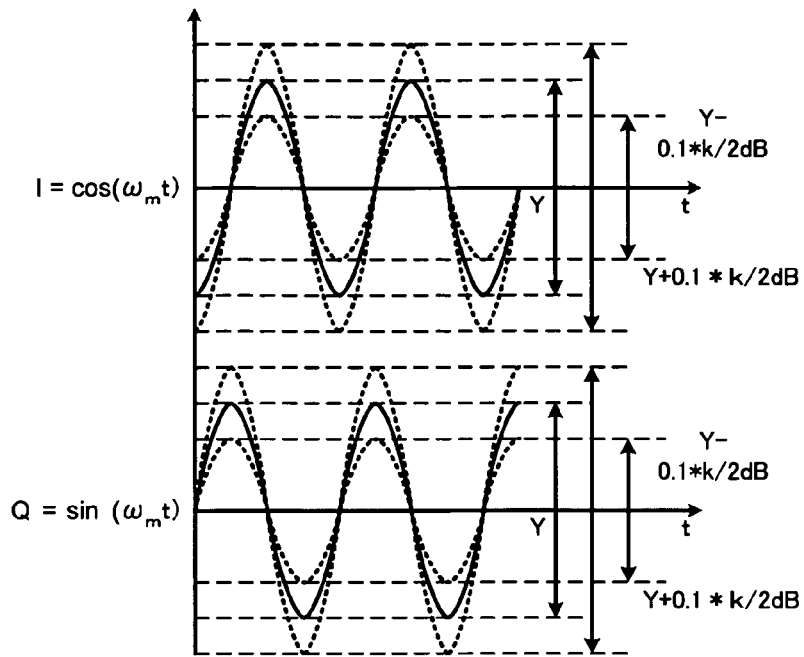
FIG. 19 is a graph showing an I-channel signal and Q-channel signal subjected to control of an amplitude control section.

FIG. 19 is a graph showing an I-channel signal and Q-channel signal subjected to control of amplitude control section 114. In this figure, when the wave shown by the solid line is set as a reference, for reference amplitude Y, the maximum amplitude is Y+0.1×k/2 dB, and the minimum amplitude is Y−0.1×k/2 dB, and it is indicated that the amplitude can be controlled between the minimum amplitude and maximum amplitude.

In addition, when a set value is calculated that is lower than the minimum amplitude or higher than the maximum amplitude, second set value calculating section 109 outputs a feedback signal to transmission power calculating section 107, and thereby controls the amplitude of the I/Q signal within a predetermined range. By this means, error vector amplitude may deteriorate due to a variation in amount of carrier leak determined by the ratio of the amplitude value of the I-channel signal and Q-channel signal and its DC value, or a ratio of adjacent channel leak power may deteriorate due to distortion in a mixer caused by a variation in amplitude of a transmission signal. However, when an amplitude value beyond a predetermined amplitude range is calculated, transmission power calculating section 107 receives the feedback signal generated in second set value calculating section 109 and makes first set value calculating section 108 and second set value calculating section 109 calculate the gain value again so that it is possible to keep the amplitude of the I-channel signal and Q-channel signal within a predetermined range, and to avoid deterioration in error vector amplitude and ratio of adjacent channel leak power.

Figure 20:
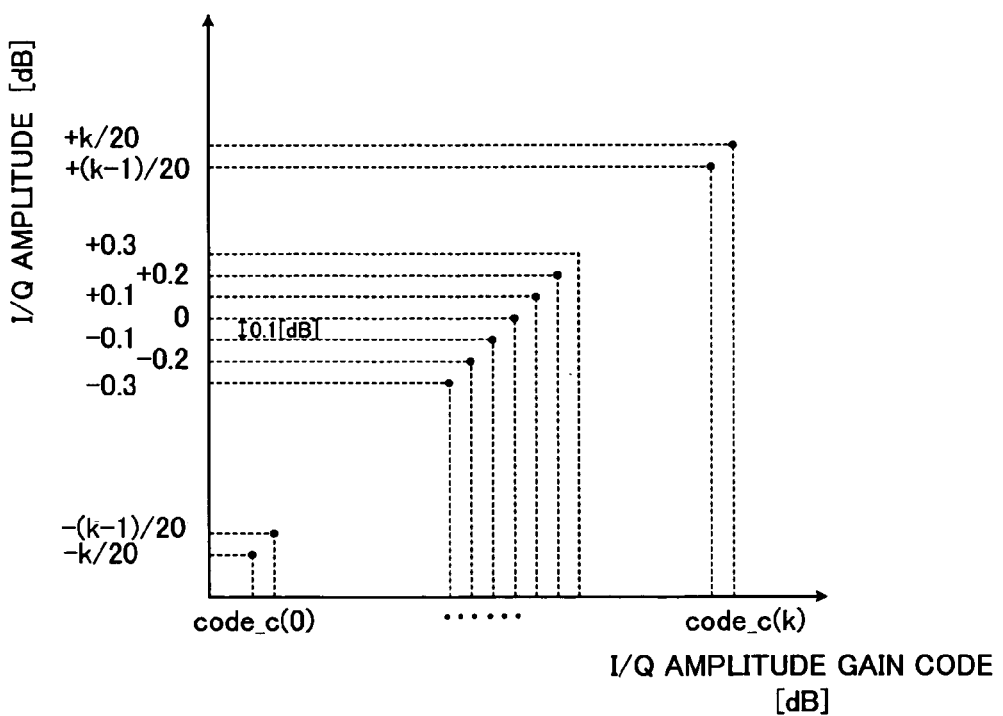
FIG. 20 is a graph showing I/Q amplitude characteristics in Embodiment 2 of the present invention.

Generally, when the transmission power is varied by amplitude control of the I/Q signal, it is difficult to obtain a wide dynamic range with the performance assured. Therefore, it is suitable to implement high resolution corresponding to 0.1 dB in a narrow dynamic range, and the I/Q amplitude characteristic as shown in FIG. 20 can be considered. Thus controlling the amplitude of I/Q signal implements the function corresponding to second variable amplifying circuit 123 with the resolution of 0.1 dB as described in Embodiment 1.

Thus, according to this Embodiment, by implementing the resolution of 0.1 dB by amplitude control of I/Q signal and combining the control with the variable amplifying circuit with the resolution of 1 dB, it is possible to reduce the circuit scale as compared with the case of providing a plurality of variable amplifying circuits.

A first aspect of the present invention is a transmission power control apparatus having a first and second variable amplifying circuits that have different gain resolutions and amplify an input signal, a correction value calculator that calculates a correction value to assure the accuracy of transmission power, a transmission power specifier that specifies transmission power to be outputted to a communicating party based on a signal transmitted from the communicating party, a transmission power calculator that calculates transmission power by correcting the specified transmission power with the correction value, and a set value calculator that calculates gain values to be set on the first and second variable amplifying circuits based on the transmission power calculated by the transmission power calculator.

According to this configuration, by providing the first and second variable amplifying circuits with different gain resolutions, taking into consideration the correction value to assure the accuracy of the transmission power, and making adjustments of the transmission power control apparatus by measuring only one arbitrary point of transmission power, it is possible to make overall gain characteristics linear and set optimal gain values on the first and second variable amplifying circuits so that the number of steps required for the adjustments can be reduced and transmission power control can be performed with high accuracy in a wide dynamic range.

A second aspect of the present invention is a transmission power control apparatus having a first variable amplifying circuit that amplifies an input signal, an amplitude controller that performs amplitude control of an I-channel signal and a Q-channel signal, a correction value calculator that calculates a correction value to assure the accuracy of transmission power, a transmission power specifier that specifies transmission power to be outputted to a communicating party based on a signal transmitted from the communicating party, a transmission power calculator that calculates transmission power by correcting the specified transmission power by the correction value, a set value calculator that calculates a gain value to be set on the first variable amplifying circuit based on the transmission power calculated by the transmission power calculator, and an amplitude value calculator that calculates an amplitude value to be set on the amplitude controller based on the corrected transmission power calculated in the transmission power calculator.

According to this configuration, by setting transmission power to be outputted to a communicating party by gain values with different resolutions respectively by the first variable amplifying circuit and the amplitude controller that controls the amplitude of the I-channel signal and Q-channel signal, taking into consideration the correction value to assure the accuracy of the transmission power, and making adjustments of the transmission power control apparatus by measuring only one arbitrary point of transmission power, it is possible to make overall gain characteristics linear and set optimal gain values on the first and second variable amplifying circuits so that the number of steps required for the adjustments can be reduced and transmission power control can be performed with high accuracy in a wide dynamic range.

A third aspect of the present invention is a transmission power control apparatus with the above-described configuration, wherein the correction value calculator has a storage that stores environment characteristic correction values to compensate for deterioration in the accuracy of transmission power caused by frequency characteristics and temperature characteristics, and when a change occurs in environment, calculates a correction value after the change in environment, using an environment characteristic correction value stored in the storage.

According to this configuration, when a change occurs in environment, by calculating a correction value after the change in environment using an environment characteristic correction value stored in the storage, it is possible to perform transmission power control with high speed and high accuracy.

A fourth aspect of the present invention is a transmission power control apparatus with the above-described configuration, wherein the correction value calculator has an error calculator that calculates an error between the transmission power specified in the transmission power specifier and actual transmission power actually outputted to the communicating party, and based on the transmission power specified by the transmission power specifier, determines whether or not correction of the error is reflected in calculation of the correction value.

According to this configuration, when transmission power is measured, since the transmission power is generally measured only in a high-level region and accuracy assurance is strictly specified in specifications in the transmission power in the high-level region, it is determined whether or not correction of the error is reflected in calculation of the correction value based on the transmission power specified by the transmission power specifier. Then, when the specified transmission power is high, since the measurement accuracy of the transmission power is high, correction of the error is reflected. Meanwhile, when the specified transmission power is low, since the measurement accuracy of the transmission power is low, correction of the error is not reflected. It is thus possible to perform transmission power control with high accuracy.

A fifth aspect of the present invention is a transmission power control apparatus with the above-described configuration, wherein the correction value calculator has a timing information generator that generates timing information for calculating the correction value, and based on the timing information, limits a correction value amount that is the number of times the correction value is calculated, and manages a period for calculating the correction value.

According to this configuration, by limiting a correction value amount that is the number of times the correction value is calculated and managing a period for calculating the correction value based on the timing information, for example, in transmission power control in the CDMA scheme and the like, it is possible to calculate the correction value with the correction value amount between slots kept within a specified value.

A sixth aspect of the present invention is a transmission power control apparatus with the above-described configuration, wherein, when a gain value beyond a dynamic range of the second variable amplifying circuit is calculated, the transmission power calculator receives a feedback signal generated by the set value calculator and makes the set value calculator calculate the gain value again.

According to this configuration, when a gain value beyond a dynamic range of the second variable amplifying circuit is calculated, by receiving a feedback signal generated by the second set value calculator and making the first set value calculator and the second set value calculator calculate respective gain values again, it is possible to perform gain control within the dynamic range of the second variable amplifying circuit and maintain the linearity of overall gain characteristics of the first variable amplifying circuit and second variable amplifying circuit.

A seventh aspect of the present invention is a transmission power control apparatus with the above-described configuration, wherein, when an amplitude value beyond a predetermined amplitude range is calculated, the transmission power calculator receives a feedback signal generated by the amplitude value calculator and makes the set value calculator and the amplitude value calculator calculate the gain value again.

According to this configuration, when amounts of variations in amplitude of the I-channel signal and Q-channel signal are made excessively large, error vector amplitude may deteriorate due to a variation in amount of carrier leak determined by the ratio of the amplitude value of the I-channel signal and Q-channel signal and its DC value, or, ratio of adjacent channel leak power may deteriorate due to distortion in a mixer caused by a variation in amplitude of a transmission signal. However, when an amplitude value beyond a predetermined amplitude range is calculated, the transmission power calculator receives the feedback signal generated in the amplitude value calculator and makes the first set value calculator and the amplitude value calculator calculate the gain value again, and it is thereby possible to keep the amplitude of the I-channel signal and Q-channel signal within a predetermined range and avoid deterioration in error vector amplitude and ratio of adjacent channel leak power.

An eighth aspect of the present invention is a transmission power control apparatus with the above-described configuration, further having a first variable amplifying circuit controller that controls the gain value of the first variable amplifying circuit, a second variable amplifying circuit controller that controls the gain value of the second variable amplifying circuit, and a gain set value controller that obtains a gain code based on the gain value calculated by the set value calculator and independently controls the first variable amplifying circuit controller and the second variable amplifying circuit controller with the obtained gain code using a predetermined control format.

According to this configuration, by independently controlling the first variable amplifying circuit controller and the second variable amplifying circuit controller with the predetermined control format, even when the first variable amplifying circuit and the second variable amplifying circuit are configured with different circuits and have different transmission power control timings, it is possible to control the circuits at the respective timings.

A ninth aspect of the present invention is a transmission power control apparatus with the above-described configuration, further having a variable amplifying circuit controller that controls respective gain values of the first variable amplifying circuit and the second variable amplifying circuit, and a gain set value controller that obtains a gain code based on the gain values calculated by the set value calculator and controls the variable amplifying circuit controller with the obtained gain code using a predetermined control format.

According to this configuration, by controlling the variable amplifying circuit controller with the predetermined control format, even when the first variable amplifying circuit and the second variable amplifying circuit are configured with the same circuit and have different transmission power control timings, it is possible to control the circuits at the respective timings.

A tenth aspect of the present invention is a transmission power control apparatus with the above-described configuration, further having a first variable amplifying circuit controller that controls the gain value of the first variable amplifying circuit, and a gain set value controller that obtains a gain code based on the gain value calculated by the set value calculator and independently controls the first variable amplifying circuit controller and the amplitude controller with the obtained gain code using a predetermined control format.

According to this configuration, by independently controlling the first variable amplifying circuit controller and the amplitude controller with the predetermined control format, even when the first variable amplifying circuit and the amplitude controller are configured with different circuits and have different transmission power control timings, it is possible to control the circuits at the respective timings.

The present application is based on Japanese Patent Application No. 2004-035027 filed on Feb. 12, 2004, entire content of which is expressly incorporated by reference herein.

INDUSTRIAL APPLICABILITY

The transmission power control apparatus according to the present invention has the advantageous effects of reducing the number of steps required for adjustments and performing transmission power control with high accuracy in a wide dynamic range, and is applicable to radio communication apparatuses.

The invention claimed is:

1. A transmission power control apparatus comprising:
a first variable amplifying circuit that has a first gain resolution and amplifies an input signal;
a second variable amplifying circuit that has a second gain resolution higher than the first gain resolution and amplifies an input signal;
a transmission power specifier that specifies transmission power to be outputted to a communicating party based on a signal transmitted from the communicating party;
a correction value calculator that calculates a correction value to assure the accuracy of the transmission power;
a transmission power calculator that calculates transmission power by correcting the specified transmission power by the correction value; and a set value calculator that calculates gain values to be set on the first variable amplifying circuit and the second variable amplifying circuit based on the corrected transmission power calculated by the transmission power calculator, wherein, when a gain value beyond a dynamic range of the second variable amplifying circuit is calculated, the transmission power calculator receives a feedback signal generated by the set value calculator and makes the set value calculator calculate the gain value again.

2. The transmission power control apparatus according to claim 1, wherein the correction value calculator comprises a storage that stores environment characteristic correction values to compensate for deterioration in the accuracy of transmission power caused by frequency characteristics and temperature characteristics, and when a change occurs in environment, calculates a correction value after the change in environment, using an environment characteristic correction value stored in the storage.

3. The transmission power control apparatus according to claim 2, wherein the correction value calculator comprises a timing information generator that generates timing information for calculating the correction value, and based on the timing information, limits a correction value amount that is the number of times the correction value is calculated and manages a period for calculating the correction value.

4. The transmission power control apparatus according to claim 1, wherein the correction value calculator comprises an error calculator that calculates an error between the transmission power specified in the transmission power specifier and actual transmission power actually outputted to the communicating party, and based on the transmission power specified by the transmission power specifier, determines whether or not correction of the error is reflected in calculation of the correction value.

5. The transmission power control apparatus according to claim 1, further comprising:
a first variable amplifying circuit controller that controls the gain value of the first variable amplifying circuit;
a second variable amplifying circuit controller that controls the gain value of the second variable amplifying circuit; and
a gain set value controller that obtains a gain code based on the gain value calculated by the set value calculator and independently controls the first variable amplifying circuit controller and the second variable amplifying circuit controller with the obtained gain code using a predetermined control format.

6. The transmission power control apparatus according to claim 1, further comprising:
a variable amplifying circuit controller that controls respective gain values of the first variable amplifying circuit and the second variable amplifying circuit; and
a gain set value controller that obtains a gain code based on the gain values calculated by the set value calculator, and controls the variable amplifying circuit controller with the obtained gain code using a predetermined format.

7. A transmission power control apparatus comprising:
a first variable amplifying circuit that amplifies an input signal;
an amplitude controller that performs amplitude control of an I-channel signal and a Q-channel signal;
a transmission power specifier that specifies transmission power to be outputted to a communicating party based on a signal transmitted from the communicating party;
a correction value calculator that calculates a correction value to assure the accuracy of the transmission power;
a transmission power calculator that calculates transmission power by correcting the specified transmission power by the correction value;
a set value calculator that calculates a gain value to be set on the first variable amplifying circuit based on the transmission power calculated by the transmission power calculator; and
an amplitude value calculator that calculates an amplitude value to be set on the amplitude controller based on corrected transmission power calculated in the transmission power calculator, wherein, when an amplitude value beyond a predetermined amplitude range is calculated, the transmission power calculator receives a feedback signal generated by the amplitude value calculator and makes the set value calculator and the amplitude value calculator calculate the gain value again.

8. The transmission power control apparatus according to claim 7, further comprising:
a first variable amplifying circuit controller that controls the gain value of the first variable amplifying circuit; and
a gain set value controller that obtains a gain code based on the gain value calculated by the set value calculator and independently controls the first variable amplifying circuit controller and the amplitude controller with the obtained gain code using a predetermined control format.

* * * * *